(12) United States Patent
Wang et al.

(10) Patent No.: US 9,711,653 B2
(45) Date of Patent: Jul. 18, 2017

(54) THIN FILM TRANSISTOR, METHOD FOR FABRICATING THE SAME AND DISPLAY APPARATUS

(71) Applicant: BOE TECHNOLOGY GROUP CO., LTD., Beijing (CN)

(72) Inventors: Meili Wang, Beijing (CN); Chunsheng Jiang, Beijing (CN); Dongfang Wang, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 14/409,333

(22) PCT Filed: Jun. 20, 2014

(86) PCT No.: PCT/CN2014/080454
§ 371 (c)(1),
(2) Date: Dec. 18, 2014

(87) PCT Pub. No.: WO2015/051650
PCT Pub. Date: Apr. 16, 2015

(65) Prior Publication Data
US 2015/0349140 A1  Dec. 3, 2015

(30) Foreign Application Priority Data

Oct. 11, 2013  (CN) .......................... 2013 1 0473410

(51) Int. Cl.
*H01L 21/00* (2006.01)
*H01L 29/786* (2006.01)
(Continued)

(52) U.S. Cl.
CPC .... *H01L 29/78696* (2013.01); *H01L 21/0217* (2013.01); *H01L 21/02164* (2013.01);
(Continued)

(58) Field of Classification Search
CPC .......... H01L 29/66742; H01L 29/7869; H01L 29/78696
(Continued)

(56) References Cited

U.S. PATENT DOCUMENTS 7,638,360 B2 * 12/2009 Ryu .................... H01L 29/7869
257/43
7,879,698 B2 *  2/2011 Ye ....................... H01L 29/7869
257/E21.09
(Continued)

FOREIGN PATENT DOCUMENTS

| CN | 102646714 A | 8/2012 |
| CN | 103500170 A | 1/2014 |
| WO | WO 2013/106166 | * 7/2013 ............. H01L 29/12 |

OTHER PUBLICATIONS

Lu et al., "p-type conduction in N-Al co-doped ZnO thin films", Applied Physics Letters 85 (2004) pp. 3134-3135.*
(Continued)

*Primary Examiner* — Jay C Kim
(74) *Attorney, Agent, or Firm* — Banner & Witcoff, Ltd.

(57) ABSTRACT

Embodiments of the present invention provide a thin film transistor, method for fabricating the thin film transistor and display apparatus. The method includes steps of: forming an active layer pattern which has a mobility greater than a predetermined threshold from an active layer material; and performing ion implantation on the active layer pattern. The energy of a compound bond formed from the implanted ions is greater than that of a compound bond formed from ions in the active layer material, thereby reducing the chance of vacancy formation and reducing the carrier concentration. Therefore, the mobility of the active layer surface is reduced, the leakage current is reduced, the threshold volt-
(Continued)

age is adjusted to shift toward positive direction and performance of the thin film transistor is improved.

6 Claims, 3 Drawing Sheets

(51) Int. Cl.
| | |
|---|---|
| H01L 29/66 | (2006.01) |
| H01L 21/266 | (2006.01) |
| H01L 21/02 | (2006.01) |
| H01L 27/32 | (2006.01) |
| H01L 21/265 | (2006.01) |

(52) U.S. Cl.
CPC .......... *H01L 21/265* (2013.01); *H01L 21/266* (2013.01); *H01L 27/3244* (2013.01); *H01L 29/66742* (2013.01); *H01L 29/66969* (2013.01); *H01L 29/7869* (2013.01); *H01L 29/78609* (2013.01)

(58) Field of Classification Search
USPC .................................. 438/104, 149, 151, 162
See application file for complete search history.

(56) References Cited

U.S. PATENT DOCUMENTS

| | | | | |
|---|---|---|---|---|
| 7,923,722 B2* | 4/2011 | Ryu | ................. | H01L 21/02554 257/43 |
| 7,927,713 B2* | 4/2011 | Ye | ................. | C23C 14/0036 257/43 |
| 7,988,470 B2* | 8/2011 | Ye | ................. | H01L 29/78606 257/E21.231 |
| 7,994,508 B2* | 8/2011 | Ye | ................. | H01L 29/7869 257/43 |
| 8,012,794 B2* | 9/2011 | Ye | ................. | H01L 21/02521 257/43 |
| 8,013,339 B2* | 9/2011 | Shih | ................. | H01L 29/4908 257/327 |
| 8,143,093 B2* | 3/2012 | Ye | ................. | H01L 29/7869 257/43 |
| 8,164,090 B2* | 4/2012 | Iwasaki | ................. | H01L 29/78618 257/43 |
| 8,421,081 B2* | 4/2013 | Kato | ................. | G11C 11/404 257/292 |
| 8,669,552 B2* | 3/2014 | Ye | ................. | H01L 29/41733 257/290 |
| 8,754,409 B2* | 6/2014 | Yamazaki | ................. | H01L 27/0688 257/365 |
| 8,823,092 B2* | 9/2014 | Yamazaki | ................. | H01L 29/4908 257/335 |
| 8,829,515 B2* | 9/2014 | Seon | ................. | H01L 29/66969 257/43 |
| 8,840,763 B2* | 9/2014 | Ye | ................. | C23C 14/0036 204/192.15 |
| 8,907,392 B2* | 12/2014 | Yamazaki | ................. | H01L 27/108 257/250 |
| 8,980,066 B2* | 3/2015 | Ye | ................. | C23C 14/0063 204/192.15 |
| 9,076,721 B2* | 7/2015 | Park | ................. | H01L 29/66969 |
| 9,105,749 B2* | 8/2015 | Sasagawa | ................. | H01L 21/8252 |
| 9,184,300 B2* | 11/2015 | Son | ................. | H01L 29/78618 |
| 9,209,092 B2* | 12/2015 | Yamazaki | ................. | H01L 21/84 |
| 9,218,966 B2* | 12/2015 | Honda | ................. | H01L 21/02554 |
| 9,240,488 B2* | 1/2016 | Yamazaki | ................. | H01L 21/02565 |
| 9,287,407 B2* | 3/2016 | Koezuka | ................. | H01L 29/78618 |
| 2009/0321731 A1 | 12/2009 | Jeong et al. | | |
| 2011/0147738 A1* | 6/2011 | Yamazaki | ................. | H01L 21/02565 257/43 |
| 2012/0001167 A1* | 1/2012 | Morosawa | ................. | H01L 29/7869 257/43 |
| 2012/0132905 A1* | 5/2012 | Yamazaki | ................. | H01L 29/4908 257/43 |
| 2012/0132906 A1* | 5/2012 | Yamazaki | ................. | H01L 21/02439 257/43 |
| 2012/0223303 A1* | 9/2012 | Ye | ................. | H01L 29/41733 257/43 |
| 2012/0252173 A1* | 10/2012 | Imoto | ................. | H01L 21/0242 438/151 |
| 2012/0292628 A1 | 11/2012 | Tian et al. | | |
| 2013/0280859 A1* | 10/2013 | Kim | ................. | H01L 29/7869 438/104 |
| 2014/0151690 A1* | 6/2014 | Kim | ................. | H01L 29/7869 257/43 |
| 2014/0216929 A1* | 8/2014 | Hosokawa | ................. | C23C 14/3414 204/298.13 |
| 2015/0060990 A1* | 3/2015 | Kim | ................. | H01L 29/7869 257/324 |
| 2015/0062475 A1* | 3/2015 | Kim | ................. | H01L 29/78648 349/43 |

OTHER PUBLICATIONS

Ye et al., "High mobility amorphous zinc oxynitride semiconductor material for thin film transistors", Journal of Applied Physics 106 (2009) 074512.*
Matsuda et al., "Sheet resistance and crystallinity of Ga- and Al-implanted zinc oxide thin films with postannealing", Journal of Vacuum Science and Technology A 25 (2007) pp. 706-710.*
Lim et al., "High performance thin film transistor with low temperature atomic layer deposition nitrogen-doped ZnO", Applied Physics Letters 91 (2007) 183517.*
Shtereva et al., "Carrier Control in Polycrystalline ZnO:Ga Thin Films via Nitrogen Implantation", ECS Journal of Solid State Science and Technology 1 (2012) p. 237-p. 240.*
Reuss et al., "Optical investigations on the annealing behavior of gallium- and nitrogen-implanted ZnO", Journal of Applied Physics 95 (2004) pp. 3385-3390.*
Nakahara et al., "Growth of N-doped and Ga + N-codoped ZnO films by radical source molecular beam epitaxy", Journal of Crystal Growth 237-239 (2002) pp. 503-508.*
Matsui et al., "Influence of Codoping with Ga on the Electrical and Optical Properties of N-Doped ZnO Films", Journal of the Electrochemical Society 150 (2003) pp. G508-G512.*
Matsui et al., "Role of Ga for Co-doping of Ga with N in ZnO Films", Japanese Journal of Applied Physics 42 (2003) pp. 5494-5499.*
Kohiki et al., "Enhanced electrical conductivity of zinc oxide thin films by ion implantation of gallium, aluminum, and boron atoms", Journal of Applied Physics 75 (1994) pp. 2069-2072.*
International Search Report and Written Opinion mailed Sep. 17, 2014 (PCT/CN2014/080454); ISA/CN.
Apr. 12, 2016—International Preliminary Report on Patentability Appn PCT/CN2014/080454.
Nomura, Kenji et al. "Amorphous Oxide Semiconductors for High-Performace Flexible Thin-Film Transistors" Japanese Journal of Applied Physics, May 25, 2016, pp. 4303-4308, vol. 45, No. 5B, The Japan Society of Applied Physics.
Zou, Xiao et al. "Enhanced performance of a-IGZO thin-film transistors by forming AZO/IGZO heterojunction source/drain contacts" Semiconductor Science and Technology, Mar. 11, 2011, IOP Publishing.

* cited by examiner

THIN FILM TRANSISTOR, METHOD FOR FABRICATING THE SAME AND DISPLAY APPARATUS

The application is a U.S. National Phase Entry of International Application PCT/CN2014/080454 filed on Jun. 20, 2014, designating the United States of America and claiming priority to Chinese Patent Application No. 201310473410.3, filed on Oct. 11, 2013. The present application claims priority to and the benefit of the above-identified applications and the above-identified applications are incorporated by reference herein in their entirety.

TECHNICAL FIELD

Embodiments of the present invention relate to a thin film transistor, a method for fabricating the thin film transistor and a display apparatus.

BACKGROUND

In current active matrix organic light emitting diode (AMOLED) display panels, the light emitting effect of the electroluminescence layer is improved by using the change in the current intensity generated between two electrodes which are disposed on two opposite sides of the electroluminescence layer, so that the displayed image can be controlled by the light emitting. In general, an AMOLED display panel typically comprises an OLED member and a thin film transistor (TFT) array. The TFT comprises a gate, a source, a drain and an active layer. The gate is connected to the metal electrode of the OLED, the source is connected to a data line, the drain is connected to a pixel electrode of the OLED, and the active layer is formed between the source/drain and the gate.

In the existing AMOLED TFT, in order to improve the charge ratio of the pixel electrode and reduce response time, it is necessary to improve the mobility of the active layer as much as possible. For example, during the fabrication of the TFT, materials such as zinc oxynitride may be used as the active layer.

However, in case that material having high mobility is used as the active layer, performance of the TFT may be impacted due to the large leakage current and the large negative shift of the threshold voltage induced by the excessive mobility.

SUMMARY

Embodiments of the present invention provide a thin film transistor, a method for fabricating the thin film transistor and a display apparatus, so as to solve the problem of large leakage current and large negative shift of the threshold voltage in case that the material of the active layer has a high mobility.

Embodiments of the present invention provide a method for fabricating a thin film transistor, comprising: forming an active layer pattern from an active layer material, the active layer pattern having a mobility greater than a predetermined threshold; and performing ion implantation on the active layer pattern, wherein the energy of a compound bond formed from the implanted ions is greater than the energy of a compound bond formed from ions in the active layer material.

In at least one embodiment of the present invention, by performing ion implantation on the active layer, the energy of the compound bond in the active layer is increased, chance of vacancy formation is reduced, the carrier concentration is reduced, and surface mobility of the active layer is reduced. Therefore, leakage current is reduced, threshold voltage is adjusted to shift toward positive direction and performance of the thin film transistor is improved.

Further, in at least one embodiment of the present invention, in order to prevent the active layer surface from being impacted by the ion implantation, before performing ion implantation on the active layer pattern, the method further comprises: forming an etch stop layer pattern on the active layer pattern; and forming a source/drain pattern on both the etch stop layer pattern and the active layer pattern.

Further, in at least one embodiment of the present invention, before performing ion implantation on the active layer pattern, the method further comprises: forming a protection layer on both the etch stop layer pattern and the source/drain pattern.

For example, the protection layer may be a laminated layer of SiOx and SiNx.

Further, in at least one embodiment of the present invention, before forming the active layer pattern which has mobility greater than the predetermined threshold from an active layer material, the method further comprises: forming a gate pattern on a substrate; and forming a gate insulating layer on both the gate pattern and the substrate.

Therefore, the active layer pattern having mobility greater than the predetermined threshold is formed on the gate insulating layer.

For example, the active layer material may be zinc oxynitride.

For example, the implanted ions may be Ga ions or Al ions.

Embodiments of the present invention further provide a thin film transistor comprising an active layer pattern, an material of the active layer pattern has a mobility greater than a predetermined threshold, and a surface of the active layer pattern is doped with predetermined ions, an energy of a compound bond formed from the predetermined ions is greater than the energy of a compound bond formed from the ions in the material of the active layer pattern.

Embodiments of the present invention further provide a thin film transistor fabricated by the method for fabricating a thin film transistor provided according to embodiments of the present invention.

Embodiments of the present invention further provide a display apparatus comprising the thin film transistor provided according to embodiments of the present invention.

Embodiments of the present invention provide a thin film transistor, a method for fabricating the thin film transistor and a display apparatus. When the mobility of the active layer material is greater than a predetermined threshold, in order to avoid larger leakage current caused by high mobility of the active layer, ion implantation is performed on the active layer to increase the energy of the compound bond of the active layer surface so as to reduce the chance of vacancy formation and reduce the carrier concentration. Therefore, the mobility of the active layer surface is reduced, thus leakage current is reduced, threshold voltage is adjusted to shift toward positive direction and performance of the thin film transistor is improved.

DETAILED DESCRIPTION

Figure 1A:
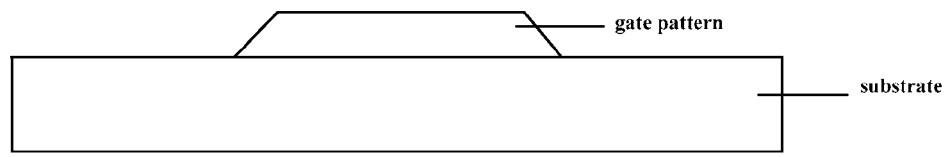
FIG. 1a is a structural schematic view of a thin film transistor in which the gate pattern is formed during the fabricating process of the thin film transistor according to an embodiment of the present invention.

In order to make objects, technical solutions and advantages of the embodiments of the invention apparent, the technical solutions of the embodiment will be described clearly and fully in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

At least one embodiment of the present invention provides a thin film transistor, a method for fabricating the thin film transistor and a display apparatus. According to the method for fabricating the thin film transistor provided by an embodiment of the present invention, when the mobility of the active layer material is greater than a predetermined threshold, in order to avoid large leakage current caused by a high mobility of the active layer, ion implantation is performed on the active layer to increase energy of the ionic bond of the active layer surface, thus reducing the chance of vacancy formation and reducing the carrier concentration. Therefore, the mobility of the active layer surface is reduced, the leakage current is reduced, threshold voltage is adjusted to shift toward positive direction and performance of the thin film transistor is improved.

At least one embodiment of the present invention provides a method for fabricating a thin film transistor, comprising the following steps.

Step S101: forming an active layer pattern from an active layer material, where the mobility of the active layer is greater than a predetermined threshold. For example, the active layer material having mobility greater than the predetermined threshold is first deposited, and then etched by using a mask so as to obtain the active layer pattern.

Step S102: performing ion implantation on the active layer pattern. The energy of the compound bond formed from the implanted ions is greater than that of the compound bond formed from the ions in the active layer material.

There are various methods to perform ion implantation, for example, the ion beam generated from ion sources is introduced into the target chamber through slits and then implanted into the target sheet. It is contemplated that those skilled in the art may perform ion implantation in other manners.

After performing ion implantation on the active layer pattern, the surface mobility of the active layer pattern is reduced, while the mobility under the surface is still high. As such, the leakage current is reduced, the threshold voltage is adjusted to shift toward positive direction, and the performance of thin film transistor is improved.

Typically, when the mobility is greater than about 30 $cm^2/Vs$, it is considered to be a high mobility, thus, the ion implantation on the active layer pattern is necessary. When the energy of the compound bond formed from the implanted ions is greater than that of the compound bond formed from ions in the active layer material, both vacancy and carrier concentration in the active layer material can be reduced and thus the surface mobility of the active layer pattern is reduced.

For example, when zinc oxynitride is used as the active layer material, mobility of the zinc oxynitride is about 100 $cm^2/Vs$. Positions provided for the carriers, i.e., free carriers, in the zinc oxynitride, are nitrogen vacancies. Since both of energy of N—Ga (N—Ga bond) and energy of N—Al (N—Al bond) are higher than that of N—Zn (N—Zn bond), it is more difficult to form nitrogen vacancy in zinc oxynitride by using Ga or Al as dopant, and thus mobility of the zinc oxynitride is reduced.

Alternatively, when IGZO (indium gallium zinc oxide) or ITZO (indium tin zinc oxide) is used as the active layer material, position provided for the carriers is oxygen vacancy. Since both of energy of O—Ga. (O—Ga bond) and energy of O—Al (O—Al bond) are higher than that of O—Zn (O—Zn bond), it is possible to use Ga or Al as dopant and reduce mobility of the IGZO or ITZO.

In order to prevent the surface of the active layer pattern from being damaged during ion implantation, after forming the active layer pattern, an etch stop layer pattern is first formed on the active layer pattern, then a source/drain pattern is formed on both the etch stop layer pattern and the active layer pattern, finally, the ion implantation is performed on the active layer. Since the energy of the implanted ions is higher, the ions may pass through the etch stop layer pattern and reach the surface of the active layer pattern so as to achieve ion implantation.

In this case, before step S102, the method further comprises: forming an etch stop layer pattern on the active layer pattern; and forming a source/drain pattern on both the etch stop layer pattern and the active layer pattern.

Further, in order to prevent performance of the TFT from being impacted by the ion implantation, before performing ion implantation on the active layer, the method further comprises forming a protection layer on both the etch stop layer pattern and the source/drain pattern.

Combination of SiOx and SiNx may be used as the protection layer. Likewise, since the energy of the implanted ions is higher, the ions may pass through the protection layer and the etch stop layer pattern, and reach the surface of the active layer pattern so as to achieve ion implantation. Ion bombardment on the surface of the active layer pattern during the ion implantation is also prevented.

As an example, a gate electrode and a gate insulating layer are further disposed under the active layer pattern. In this case, before forming an active layer from an active layer material, step S101 further comprises: forming a gate pattern on a substrate; and forming a gate insulating layer on both the gate pattern and the substrate.

In this case, the step of forming an active layer pattern having mobility greater than predetermined threshold from an active layer material is replaced with the step of forming an active layer pattern on the gate insulating layer from an active layer material having mobility greater than predetermined threshold.

For example, a method for fabricating a thin film transistor provided by an embodiment of the present invention comprises the following steps.

Step S201: forming a gate pattern on the substrate. Gate material may be deposited by magnetron sputtering method, and then patterning is performed on the gate material. Patterning of the gate may be achieved by exposure, development, etching, and lift-off processes. For example, the gate material may be metals such as Mo, Al and so on. The thin film transistor after forming the gate pattern is illustrated in FIG. 1a.

Figure 1B:
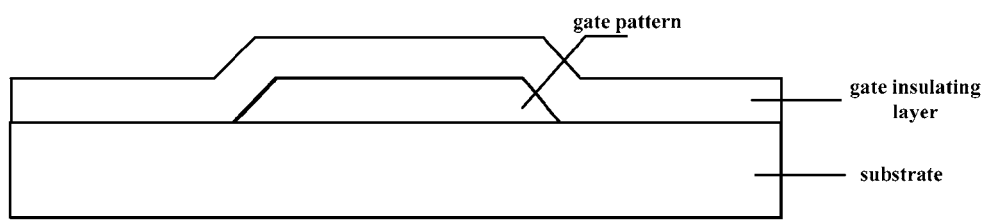
FIG. 1b is a structural schematic view of a thin film transistor in which the gate insulating layer is formed during the fabricating process of the thin film transistor according to an embodiment of the present invention.

Step S202: forming a gate insulating layer on both the gate pattern and the substrate. The gate insulating layer is a single layer or multilayer of SiOx and/or SiNx. The thin film transistor after forming the gate insulating layer is illustrated in FIG. 1b.

Figure 1C:
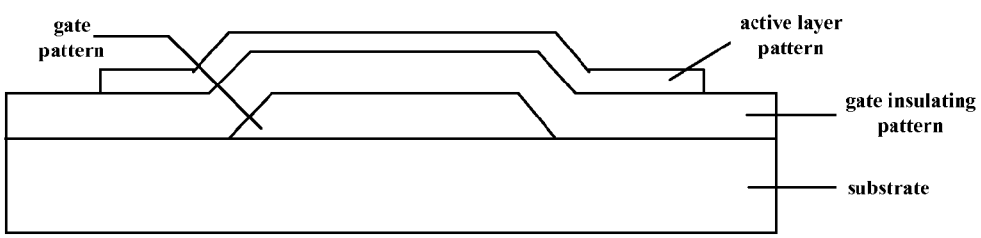
FIG. 1c is a structural schematic view of a thin film transistor in which the active layer pattern is formed during the fabricating process of the thin film transistor according to an embodiment of the present invention.

Step S203: forming an active layer pattern on the gate insulating layer from an active layer material. Zinc oxynitride is deposited on the gate insulating layer and patterned to form the active layer pattern. The thin film transistor after forming the active layer pattern is illustrated in FIG. 1c.

Figure 1D:
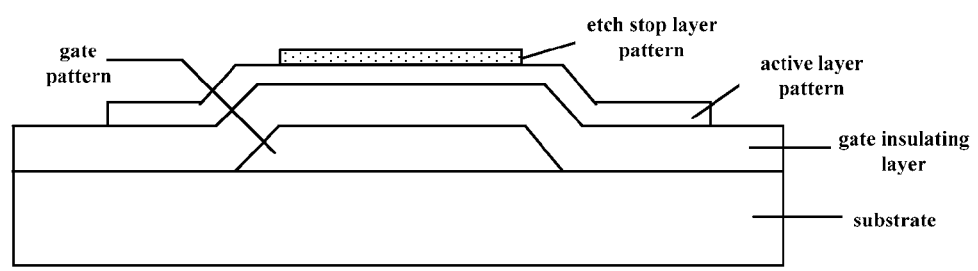
FIG. 1d is a structural schematic view of a thin film transistor in which the etch stop layer pattern is formed during the fabricating process of the thin film transistor according to an embodiment of the present invention.

Step S204: forming an etch stop layer pattern on the active layer pattern. The etch stop layer material is deposited on the active layer pattern and patterned. The thin film transistor after forming the etch stop layer pattern is illustrated in FIG. 1d.

Figure 1E:
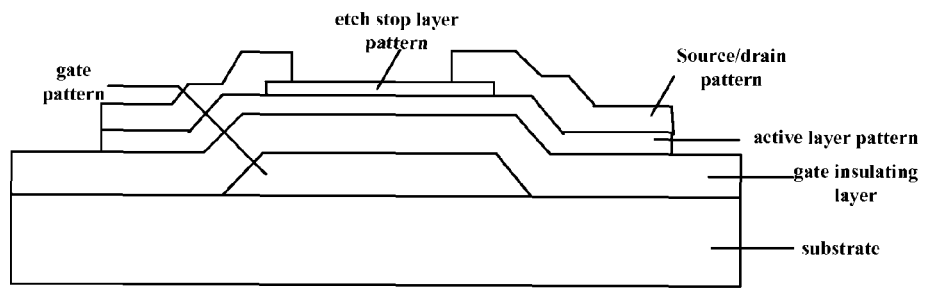
FIG. 1e is a structural schematic view of a thin film transistor in which the source/drain pattern is formed during the fabricating process of the thin film transistor according to an embodiment of the present invention.

Step S205: forming a source/drain pattern on both the etch stop layer pattern and active layer pattern. Source/drain material is deposited and patterned. The thin film transistor after forming the source/drain pattern is illustrated in FIG. 1e.

Figure 1F:
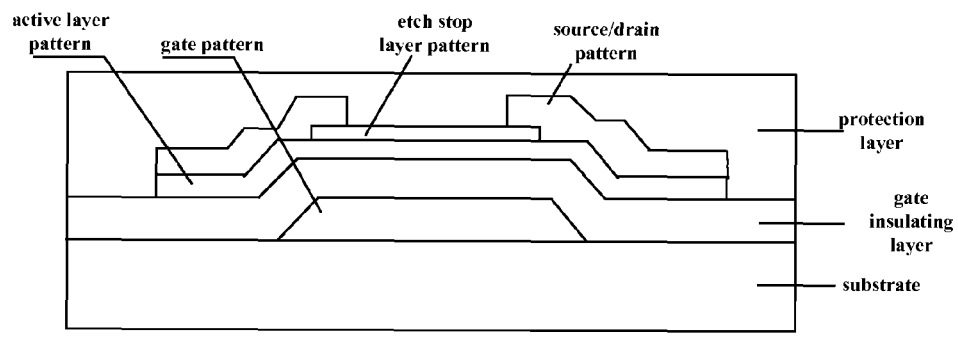
FIG. 1f is a structural schematic view of a thin film transistor in which the protection layer is formed during the fabricating process of the thin film transistor according to an embodiment of the present invention.

Step S206: forming a protection layer on both the etch stop layer pattern and source/drain pattern. The protection layer is a combination of SiOx and SiNx. The thin film transistor after forming the protection layer is illustrated in FIG. 1f.

Figure 1G:
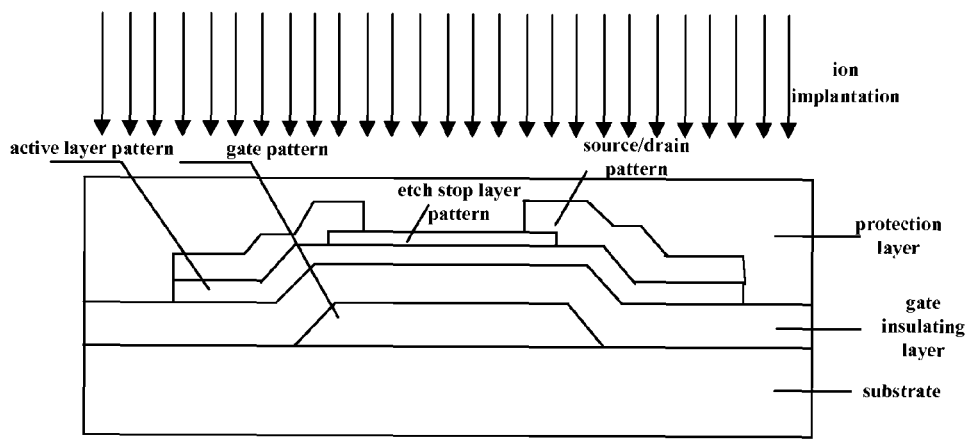
FIG. 1g is a schematic view showing performing ion implantation during the fabricating process of the thin film transistor according to an embodiment of the present invention.

Step S207: performing ion implantation on the active layer pattern as illustrated in FIG. 1g.

Figure 1H:
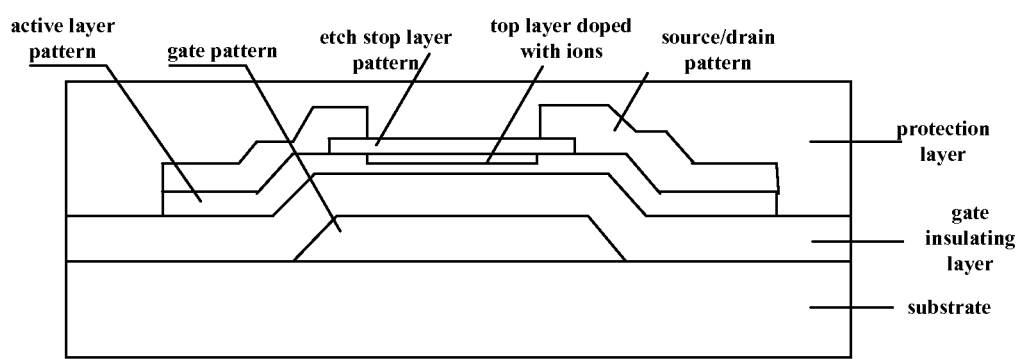
FIG. 1h is a structural schematic view of a thin film transistor according to an embodiment of the present invention.

Since the energy of the implanted ions is higher, the ions is implanted into the surface of the active layer pattern through the protection layer and etch stop layer, so that the active layer comprises a top layer doped with Ga ion or Al ion and a bottom layer of zinc oxynitride. The thin film transistor after ion implantation is illustrated in FIG. 1h.

At least one embodiment of the present invention provides a thin film transistor comprising an active layer pattern, where the mobility of the active layer material is greater than a predetermined threshold, the surface of the active layer pattern is doped with predetermined ions, such that the energy of the compound bond formed from the predetermined ions is greater than that of the compound bond formed from ions in the active layer material.

At least one embodiment of the present invention further provides a thin film transistor fabricated by the method for fabricating the thin film transistor according to embodiments of the present invention.

At least one embodiment of the present invention further provides a display apparatus comprising the thin film transistor provided by embodiments of the present invention.

At least one embodiment of the present invention provides a thin film transistor, a method for fabricating the thin film transistor and a display apparatus. When the mobility of the active layer material is greater than a predetermined threshold, in order to avoid large leakage current caused by a high mobility of the active layer, ion implantation is performed on the active layer to increase energy of the ionic bond of the active layer surface, thus reducing the chance of vacancy formation and reducing the carrier concentration. Therefore, the surface mobility of the active layer is reduced, leakage current is reduced, threshold voltage is adjusted to shift toward positive direction and performance of the thin film transistor is improved.

It is obvious that various variations and modifications can be made to embodiments of the present invention without departing spirit and scope of the present invention. If those variations and modifications are within the protection scope defined by the claims and equivalent technique, the present invention is intended to include those variations and modifications.

The present application claims priority from Chinese Application Serial Number 201310473410.3 filed on Oct. 11, 2013, the disclosure of which is hereby incorporated by reference herein in its entirety.

What is claimed is:

1. A method for fabricating a thin film transistor, comprising:
 forming an active layer pattern from zinc oxynitride; and
 implanting Ga or Al ions into a top portion of a channel region of the active layer pattern so as to convert the channel region of the active layer pattern to a top layer of zinc oxynitride doped with Ga or Al ions and a bottom layer of zinc oxynitride, such that in the thin film transistor, a mobility of the top layer is less than a mobility of the bottom layer,
 wherein before the implanting, the method further comprises:
  forming an etch stop layer pattern on the active layer pattern, and
  forming a source/drain pattern on both the etch stop layer pattern and the active layer pattern.

2. The method according to claim 1, wherein before the implanting, the method further comprises:
 forming a protection layer on both the etch stop layer pattern and the source/drain pattern.

3. The method according to claim 2, wherein the protection layer is a laminated layer of SiOx and SiNx.

4. The method according to claim 1, wherein before the forming the active layer pattern, the method further comprises:
 forming a gate pattern on a substrate; and
 forming a gate insulating layer on both the gate pattern and the substrate,
 wherein the active layer pattern is formed on the gate insulating layer.

5. The method according to claim 2, wherein before the forming the active layer pattern, the method further comprises:
 forming a gate pattern on a substrate; and
 forming a gate insulating layer on both the gate pattern and the substrate,
 wherein the active layer pattern is formed on the gate insulating layer.

6. The method according to claim 3, wherein before the forming the active layer pattern, the method further comprises:
   forming a gate pattern on a substrate; and
   forming a gate insulating layer on both the gate pattern and the substrate,
   wherein the active layer pattern is formed on the gate insulating layer.

* * * * *